United States Patent
Wang et al.

(10) Patent No.: US 12,120,848 B2
(45) Date of Patent: Oct. 15, 2024

(54) COOLING MODULE AND ELECTRONIC APPARATUS

(71) Applicant: LENOVO (SINGAPORE) PTE. LTD., Singapore (SG)

(72) Inventors: Hao-Yu Wang, Yokohama (JP); Akinori Uchino, Yokohama (JP); Hajime Yoshizawa, Yokohama (JP); Shusaku Tomizawa, Yokohama (JP)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 257 days.

(21) Appl. No.: 17/938,371

(22) Filed: Oct. 6, 2022

(65) Prior Publication Data

US 2023/0200014 A1 Jun. 22, 2023

(30) Foreign Application Priority Data

Dec. 22, 2021 (JP) .................................. 2021207889

(51) Int. Cl.
*H05K 7/20* (2006.01)
*G06F 1/20* (2006.01)

(52) U.S. Cl.
CPC ......... *H05K 7/20336* (2013.01); *G06F 1/203* (2013.01); *H05K 7/20172* (2013.01); *H05K 7/20309* (2013.01); *H05K 7/2039* (2013.01)

(58) Field of Classification Search
CPC ........... H05K 7/20336; H05K 7/20172; H05K 7/20309; H05K 7/2039

USPC ........................................................ 361/700
See application file for complete search history.

(56) References Cited

U.S. PATENT DOCUMENTS

| | | |
|---|---|---|
| 6,408,934 B1 | 6/2002 | Diamond |
| 2009/0219695 A1* | 9/2009 | Tomioka ................. G06F 1/203 165/104.26 |
| 2010/0139895 A1* | 6/2010 | Hwang ................. H01L 23/427 165/104.26 |
| 2018/0100708 A1* | 4/2018 | Hsieh ..................... H01L 23/467 |
| 2021/0015007 A1* | 1/2021 | Watanabe ............... G06F 1/203 |
| 2021/0079926 A1* | 3/2021 | He ...................... F04D 29/4246 |
| 2022/0179461 A1* | 6/2022 | North .................... G06F 1/1688 |

FOREIGN PATENT DOCUMENTS

| | | |
|---|---|---|
| JP | 2004015024 | 1/2004 |
| JP | 2021012590 A | 2/2021 |
| JP | 2022016917 A | 1/2022 |

* cited by examiner

*Primary Examiner* — Zhengfu J Feng
(74) *Attorney, Agent, or Firm* — SHIMOKAJI IP

(57) ABSTRACT

A cooling module includes: a fan having a fan housing with an intake port and an exhaust port; a fin that faces the exhaust port of the fan; a heat pipe connected to a surface of the fin; and a plate-shaped vapor chamber having a first surface and a second surface, the heat pipe being connected to the first surface while straddling one edge of the vapor chamber, the second surface at the one edge being connected to the surface of the fin to be parallel with the heat pipe, so that the one edge is disposed between the heat pipe and the fin.

7 Claims, 5 Drawing Sheets

COOLING MODULE AND ELECTRONIC APPARATUS

BACKGROUND OF THE INVENTION

Field of the Invention

The present invention relates to a cooling module and an electronic apparatus including a cooling module.

Description of the Related Art

Electronic apparatuses such as laptop PCs are equipped with a heating element such as a CPU. These electronic apparatuses have a cooling module inside the chassis to absorb the heat generated by the heating element and dissipate it to the outside. In Japanese Patent Publication No. 6934093, the present applicant has proposed a configuration including a plate-shaped vapor chamber connecting between the CPU and the fins.

SUMMARY OF THE INVENTION

Vapor chambers are higher in component cost than typical heat pipes. The configuration in Japanese Patent Publication No. 6934093 includes a large-area vapor chamber to connect the CPU to the fins, resulting in a high overall cost of the cooling module. If the area of the vapor chamber is simply reduced, the cost can be reduced, which unfortunately will lead to a reduction also in the cooling performance.

In view of these problems of the conventional technology, the present invention aims to provide a cooling module and an electronic apparatus including a cooling module, which are capable of reducing the cost while having enough cooling performance.

A cooling module according to the first aspect of the present invention includes: a fan having a fan housing with an intake port and an exhaust port; a fin that faces the exhaust port of the fan; a heat pipe connected to a surface of the fin; and a plate-shaped vapor chamber having a first surface and a second surface, the heat pipe being connected to the first surface while straddling one edge of the vapor chamber, the second surface at the one edge being connected to the surface of the fin to be parallel with the heat pipe, so that the one edge is disposed between the heat pipe and the fin.

An electronic apparatus according to the second aspect of the present invention includes: a chassis; a heating element in the chassis; and a cooling module in the chassis, the cooling module absorbing heat generated from the heating element, the cooling module including: a fan having a fan housing with an intake port and an exhaust port; a fin that faces the exhaust port of the fan; a heat pipe having a first end connected to the heating element and a second end connected to a surface of the fin; and a plate-shaped vapor chamber having a first surface and a second surface, the heat pipe being connected to the first surface while straddling one edge of the vapor chamber, the second surface at the one edge being connected to the surface of the fin to be parallel with the second end of the heat pipe, so that the one edge is disposed between the heat pipe and the fin.

The above-described aspects of the present invention reduce the cost while having enough cooling performance.

DETAILED DESCRIPTION OF THE INVENTION

Figure 1:
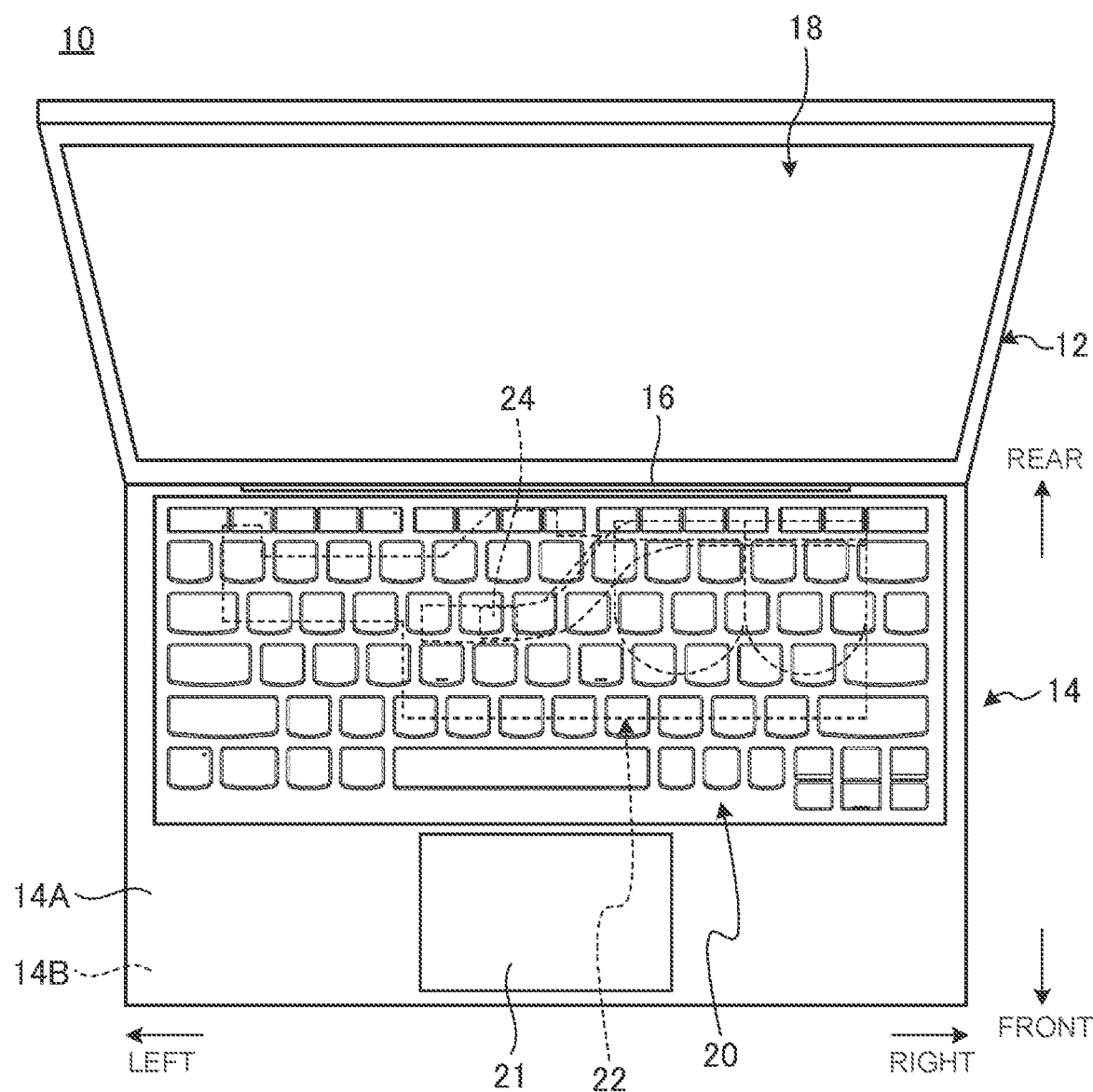
FIG. 1 is a schematic top plan view of an electronic apparatus according to one embodiment.

Referring to the drawings, the following describes an electronic apparatus and a cooling module according to the present invention in details by way of a preferable embodiment.

FIG. 1 is a schematic top plan view of an electronic apparatus 10 according to one embodiment. As illustrated in FIG. 1, the electronic apparatus 10 is a clamshell-shaped laptop PC including a lid 12 and a chassis 14 that are relatively rotatably connected with a hinge 16, and may be called a mobile workstation. The electronic apparatus according to the present invention may be of various types other than the laptop PC, including a desktop PC, a tablet PC, and a game machine.

The lid 12 is a thin, flat box. The lid 12 comes with a display 18. The display 18 includes an organic EL display or a liquid crystal display, for example.

The following describes the chassis 14 and the elements mounted on this, assuming that, with reference to the posture of the lid 12 that is opened from the chassis 14 as illustrated in FIG. 1 allowing a user to operate a keyboard 20, a part closer to the user is front, a part away from the user is rear, the width is left and right, and the height (thickness of the chassis 14) is top and bottom.

The chassis 14 is a thin, flat box. The chassis 14 has a cover member 14A that defines the top face and four surrounding side faces and a cover member 14B that defines the bottom face. The upper cover member 14A has a substantially bathtub shape with the bottom face open. The lower cover member 14B has a substantially flat plate shape, and serves as a lid that closes the bottom-face opening of the cover member 14A. These cover members 14A and 14B are overlapped in the thickness direction and are detachably connected to each other. The top face of the chassis 14 comes with the keyboard 20 and a touchpad 21.

The chassis 14 accommodates a cooling module 22 according to the present embodiment therein. The chassis 14 also accommodates a motherboard, on which the central processing unit (CPU) 24 is mounted, a storage device, a battery device, and other components therein. The cooling module 22 is a cooling device that absorbs and diffuses the heat generated from the CPU, for example, which is a heating element mounted on the motherboard, and discharges the heat to the outside of the chassis 14.

Figure 2:
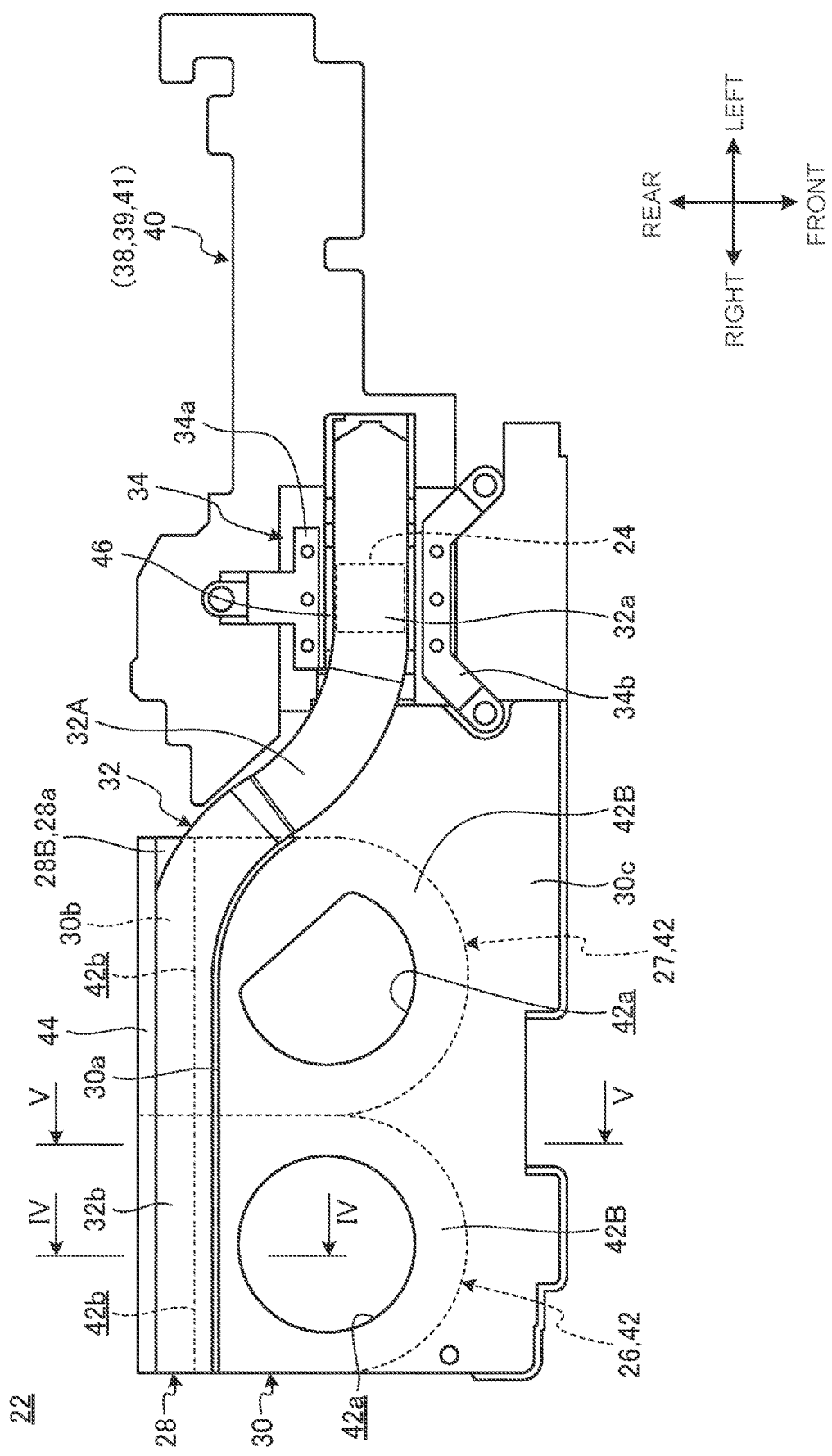
FIG. 2 is a bottom view of a cooling module.
Figure 3:
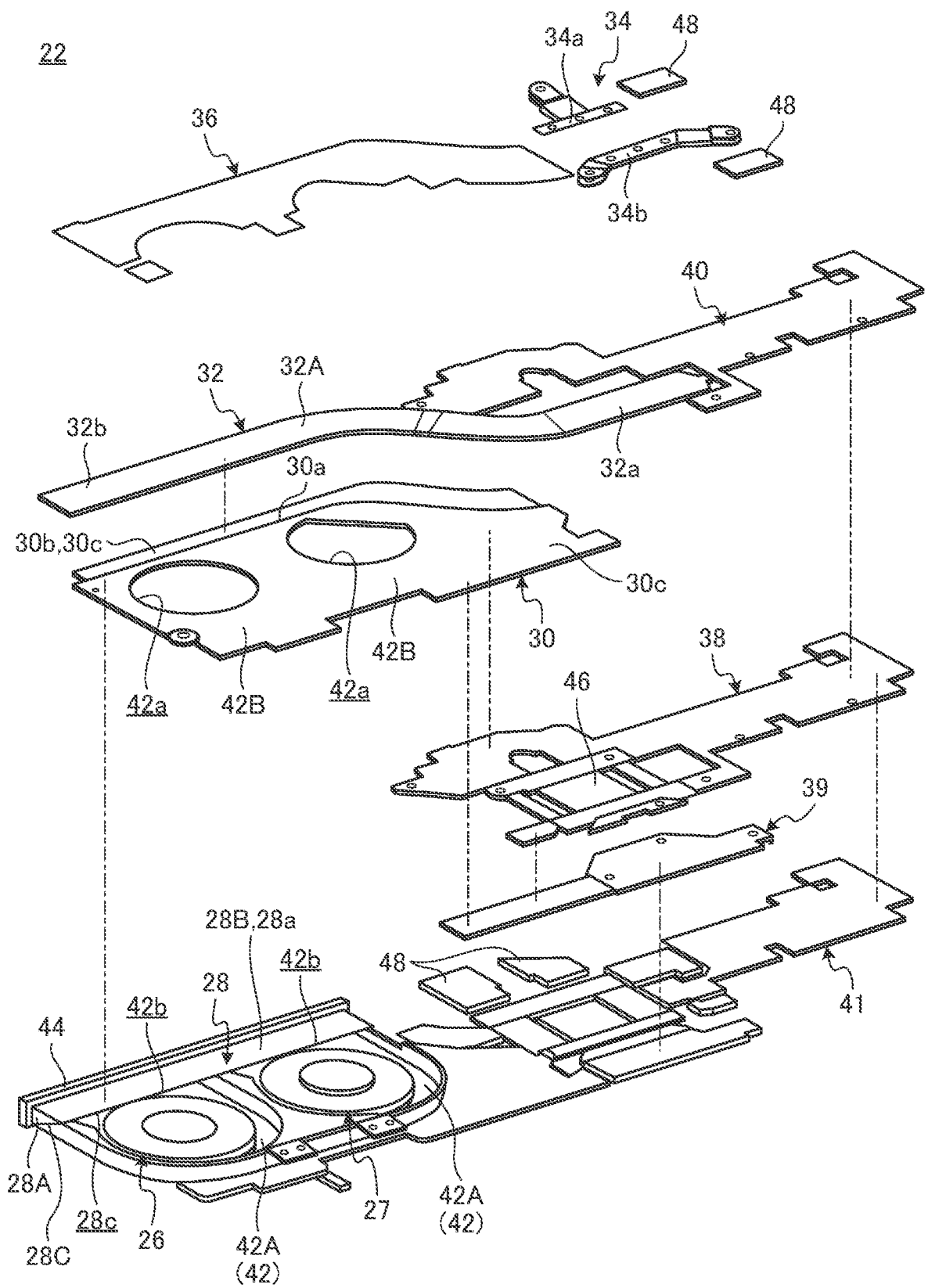
FIG. 3 is an exploded perspective view of the cooling module.
Figure 4:
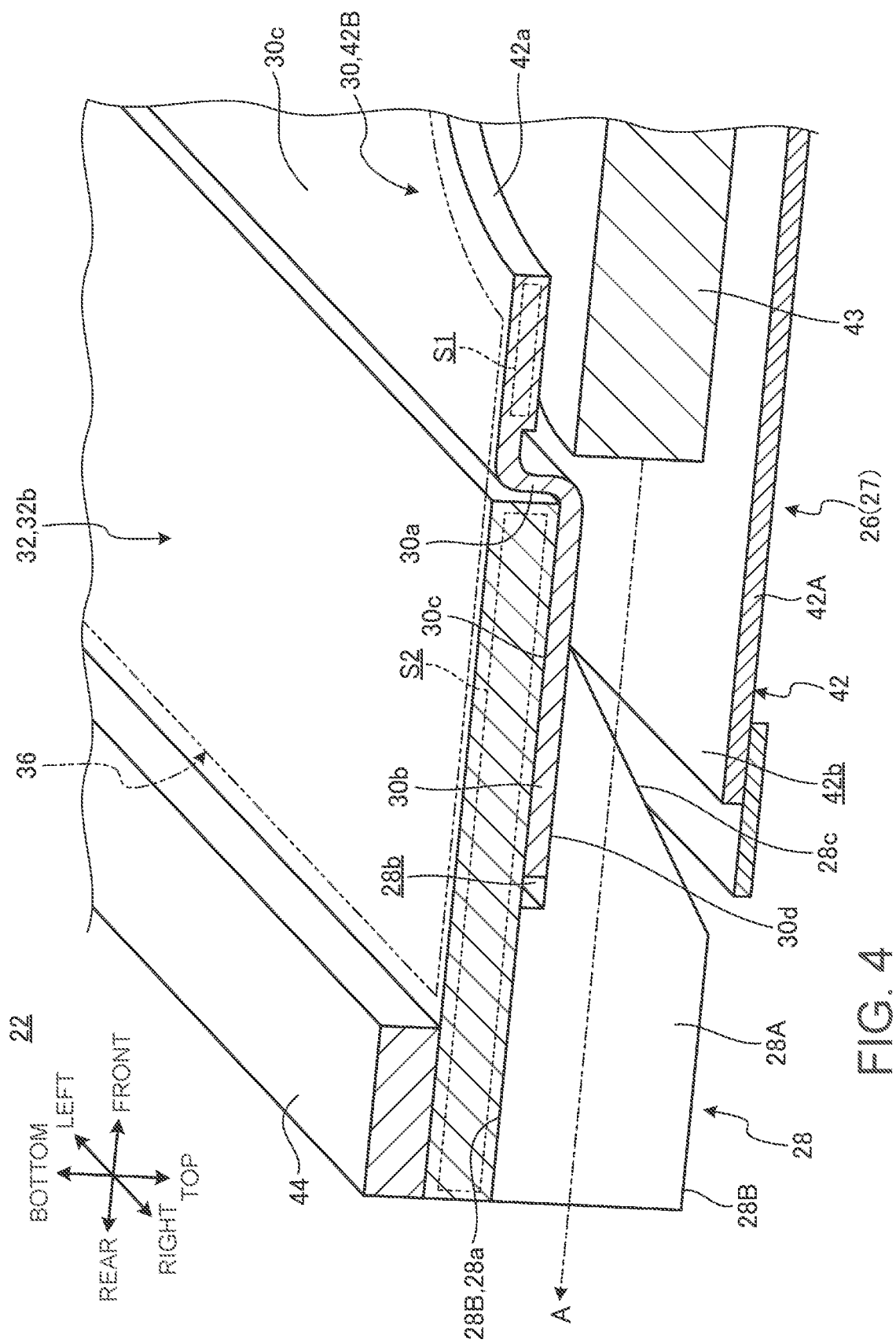
FIG. 4 is a schematic perspective cross-sectional view along line IV-IV in FIG. 2.
Figure 5:
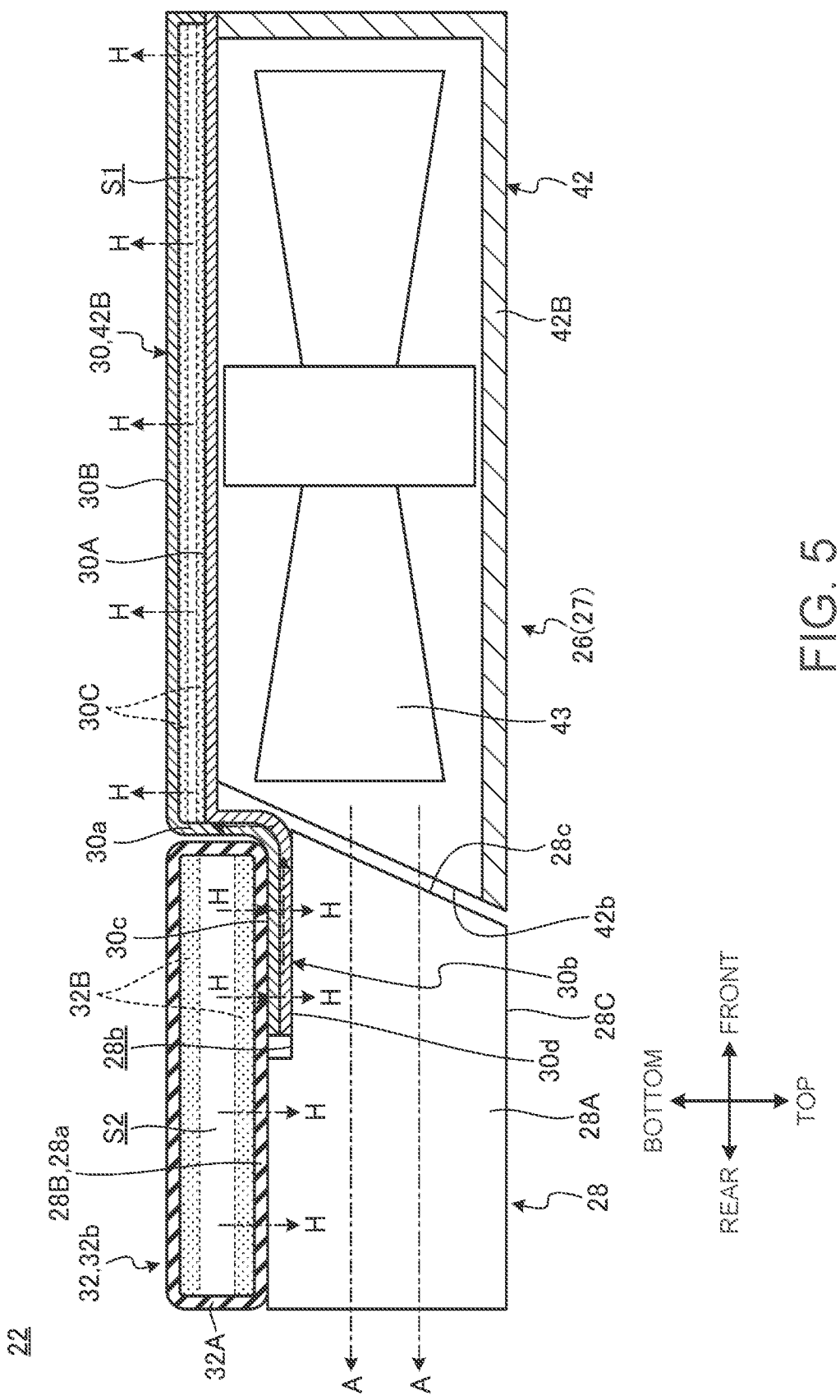
FIG. 5 is a schematic cross-sectional view taken along the line V-V in FIG. 2.

FIG. 2 is a bottom view of the cooling module 22. FIG. 3 is an exploded perspective view of the cooling module 22. FIG. 4 is a schematic perspective cross-sectional view along line IV-IV in FIG. 2. FIG. 5 is a schematic cross-sectional view taken along the line V-V in FIG. 2.

As illustrated in FIGS. 2 and 3, the cooling module 22 includes fans 26 and 27, a fin 28, a vapor chamber 30, a heat pipe 32, a pressing component 34, a heat conduction sheet 36, heat conduction plates 38 and 39, and a frame plate 40.

The fans 26 and 27 blow air to the fin 28. The fans 26 and 27 are adjacent to each other and placed side by side in the left-right direction. Only one fan 26 or 27 may be used instead of a pair on the left and right.

The fan 26 on the right is a centrifugal fan that rotates an impeller 43 housed inside a fan housing 42 by a motor (see FIG. 5). In addition to the impeller 43, the fan housing 42 also supports a control board, a motor, and the like. The fan 26 draws air in through an intake port 42*a* opening at the bottom face of the fan housing 42 and discharges the air inside the chassis 14 through an exhaust port 42*b* at the rear side face. The intake port 42*a* may be located at the top face of the fan housing 42, or may be located at each of the top and bottom faces.

The fan housing 42 includes a substantially bathtub-shaped upper cover plate 42A that defines the top and outer side faces and a flat lower cover plate 42B that defines the bottom face (see FIG. 3). The upper cover plate 42A is formed by processing (e.g., bending) a plate made of metal such as aluminum or stainless steel. The vapor chamber 30 doubles as the lower cover plate 42B, the details of which will be described later.

The fan 27 on the left is slightly different in shape of the intake port 42*a*, for example, but has the basic configuration that is symmetrical with the above-mentioned fan 26. Therefore, like numerals for the fan 27 in the drawings indicate like components of the fan 26, and a detailed explanation is omitted.

The fin 28 dissipates the heat transported through the heat pipe 32 while receiving air blown from the fans 26 and 27. The fin 28 in the present embodiment extends over the entire width of the two fans 26 and 27 in the left-right direction. This means that the fin 28 is positioned facing the two exhaust ports 42*b* and 42*b* of the left and right fans 26, 27 so that it covers both of the exhaust ports 42*b* and 42*b*. A pair of fins 28 may be placed side by side on the left and right. In this case, each fin 28 may face the exhaust port 42*b* of the corresponding fan 26 or 27.

The fin 28 includes a plurality of thin metal plates 28A placed at equal intervals in the width direction (in the left-right direction) of the exhaust port. The upper and lower end faces of these metal plates 28A are joined to an upper plate 28B and a lower plate 28C, thereby integrating all the metal plates 28A. These metal plates 28A stand up in the top-bottom direction and extend in the front-rear direction. The adjacent metal plates 28A and 28A define a gap therebetween, through which air sent from the fans 26 and 27 passes. The plates 28A through 28C of the fin 28 are made of metal with high thermal conductivity, such as aluminum or copper. In the drawings such as FIG. 3, the plates 28A placed side by side in the left-right direction are collectively illustrated as one block member.

The fin 28 has a recessed portion 28*b* on the bottom surface 28*a*. This recessed portion 28*b* is formed in a substantially front half area of the surface 28*a* to be opposed to the side face 28*c* close to the fans 26 and 27. Thus, the surface 28*a* has a step like stairs. Reference numeral 44 in FIGS. 3 and 4 denotes a frame that covers the top, bottom, left, and right faces of the fin 28 and is located on the rear side face of the upper cover plate 42A of the fan housing 42. The frame 44 is not illustrated in FIG. 5. The frame 44 may be omitted.

The vapor chamber 30 is a plate-shaped heat transport device. As illustrated in FIG. 5, the vapor chamber 30 includes two thin metal plates 30A and 30B defining a closed space S1 therebetween, in which working fluid is enclosed. These metal plates 30A and 30B are made of metal with high thermal conductivity, such as aluminum or copper. The closed space S1 is a flow channel, through which the enclosed working fluid flows while undergoing a phase change. Examples of the working fluid include water, CFC (chlorofluorocarbon) substitutes, acetone, and butane. In the closed space S1, a wick 30C is provided, which sends the condensed working fluid by capillarity. In one example, the wick 30C includes a mesh made by knitting fine metal wires into a cotton-like pattern and a porous body such as a fine flow channel.

In FIG. 4, the entire vapor chamber 30 is illustrated as one plate, and the closed space S1 is illustrated as being surrounded by a dashed line. The same goes for the heat pipe 32 and its closed space S2 in this drawing.

The vapor chamber 30 has a step 30*a* extending along its rear edge. In one example as illustrated in FIGS. 2 and 3, the step 30*a* is inclined gradually rearward from left to right, and extends in the left-right direction in the region where it overlaps the surface 28*a* of the fin 28.

The metal plates 30A and 30B of the vapor chamber 30 have a joint 30*b* like a tab, which is a part where the outer peripheral edges of the metal plates 30A and 30B are crushed and welded together for bonding. The joint 30*b* firmly fixes the two metal plates 30A and 30B together and surrounds the closed space S1 for sealing. The joint 30*b* does not have the closed space S1 therein. This means that no heat transport by the phase change of the working fluid inside the vapor chamber 30 occurs at the joint 30*b*, but heat is transported mainly by the heat conduction in the metal plates 30A and 30B.

The step 30*a* is formed by bending a portion of the joint 30*b* surrounding the outer periphery of the vapor chamber 30 and extending along the rear edge so that the portion is located one step lower. With this configuration, a first surface 30*c*, which is the bottom face of the vapor chamber 30, has a part where the closed space S1 is formed and the joint 30*b* that are different in height with the step 30*a* therebetween. Specifically, the first surface 30*c* of the joint 30*b* is located lower than the first surface 30*c* of the portion having the closed space S1.

A second surface 30*d*, which is the top face of the joint 30*b*, is connected to the surface 28*a* of the fin 28. Specifically, the joint 30*b* is placed in the recessed portion 28*b* and is joined to the bottom face of the recessed portion 28*b* by soldering or the like. The depth of the recessed portion 28*b* is substantially the same as the plate thickness of the joint 30*b*. The joint 30*b* thereby fills the recessed portion 28*b* so that the surface 28*a* of the fin 28 substantially becomes flat.

As illustrated in FIG. 3, the vapor chamber 30 doubles as the lower cover plate 42B of the fan housing 42, which closes the bottom opening of the upper cover plate 42A having a substantially bathtub shape. The vapor chamber 30 therefore has two intake ports 42*a* corresponding to the fans 26 and 27 at the portion used as the lower cover plate 42B. Specifically, in the configuration example of FIGS. 2 and 3, one vapor chamber 30 doubles as the lower cover plate 42B of the two fans 26, 27, thereby reducing the number of components. A pair of left and right vapor chambers 30 may be provided for the lower cover plates 42B of the fans 26 and 27, respectively. The vapor chamber 30 may be used as the upper cover plate 42A.

The heat pipe 32 is a pipe-shaped heat transport device. Two or more heat pipes 32 may be used in parallel. The heat pipe 32 is made by flattening a metal pipe 32A into an elliptical cross-sectional shape, and working fluid is enclosed in the closed space S2 formed in the metal pipe. The metal pipe 32A is made of metal with high thermal conductivity, such as aluminum or copper. The closed space S2 is a flow channel, through which the enclosed working fluid flows while undergoing a phase change. The closed space S2 is provided with a wick 32B. For the heat pipe 32, the type of working fluid, the configuration of the wick 32B and the like may be the same as or similar to those in the vapor chamber 30 described above.

The heat pipe 32 connects the CPU 24 and the fin 28. The heat pipe 32 has a first end 32a that is pressed against the CPU 24 via the pressing component 34, and has a second end 32b, where the top face of the second end 32b is connected to the surface 28a of the fin 28.

Most of its total length of the heat pipe 32 except for the first end 32a is joined to the vapor chamber 30 by soldering, for example. Specifically, the heat pipe 32 extends along the step 30a of the vapor chamber 30, and is joined by soldering, for example, to the first surface 30c of the joint 30b.

In this configuration, the heat pipe 32 extends to straddle the outer edge of the joint 30b of the vapor chamber 30 that is the rear edge of the vapor chamber 30. Accordingly, the second end 32b of the heat pipe 32 is joined to the first surface 30c of the vapor chamber 30 at the front region of the top face, and is joined to the surface 28a of the fin 28 at the rear region. The joint 30b of the vapor chamber 30 is thus bonded to the surface 28a of the fin 28 alongside the heat pipe 32 and is also placed between the heat pipe 32 and the fin 28.

The pressing component 34 presses the top face of the heat pipe 32 against the CPU 24. In the present embodiment, a heat receiving plate 46 (e.g., copper plate) may be stacked on the surface of the heat pipe 32, and the pressing component 34 presses the heat pipe 32 against the CPU 24 via this heat receiving plate 46. The heat receiving plate 46 may be omitted. The pressing component 34 has a pair of blade springs 34a and 34b. The pressing component 34 urges the heat pipe 32 against the CPU 24 by the urging force of these blade springs 34a and 34b.

The heat conduction sheet 36 is a thin sheet member made of a material with high thermal conductivity, including graphite, copper, or aluminum. The heat conduction sheet 36 in this embodiment includes a graphite sheet. This heat conduction sheet 36 extends over the first surface 30c of the portion of the vapor chamber 30 having the closed space S1 and the surface of the heat pipe 32 (see FIG. 4). The heat conduction sheet 36 thereby complements the heat transfer between the heat pipe 32 and the vapor chamber 30. The heat conduction sheet 36 may be omitted.

The heat conduction plates 38 and 39 are made of metal with high thermal conductivity, such as copper or aluminum. The heat receiving plate 46 is attached to a part of the heat conduction plate 38, which is connected to the vapor chamber 30 and the heat conduction plate 39. The heat conduction plate 39 is connected to the vapor chamber 30 and the heat conduction plate 38. These heat conduction plates 38 and 39 complement the heat absorption and dissipation by the heat pipe 32 and vapor chamber 30. These heat conduction plates 38 and 39 may be omitted.

The frame plate 40 is a plate made of metal such as copper, aluminum, or stainless steel. The frame plate 40 serves as a frame connecting the heat conduction plates 38 and 39 to the vapor chamber 30 and the heat pipe 32. Specifically, the frame plate 40, the heat conduction plate 38, and the heat conduction plate 39 are stacked in order from top to bottom in FIG. 3. The frame plate 40 may be omitted. Reference numeral 41 in FIG. 3 denotes an insulating member, which is a polyethylene terephthalate (PET) sheet, for example. Reference numeral 48 in FIG. 3 denotes spacers that fill steps between the plates 38 to 40 as appropriate.

In the cooling module 22 configured as described above, the heat pipe 32 is connected so as to straddle one edge of the vapor chamber 30 on the first surface 30c, and the second surface 30d at this one edge is connected to the surface 28a of the fin 28. With this configuration, the one edge of the vapor chamber 30 is connected to the fin 28 along the heat pipe 32, and is also placed between the heat pipe 32 and the fin 28. The arrows A indicated by the dashed dotted lines in FIGS. 4 and 5 schematically illustrate the flow of air. The arrows H indicated by the dashed dotted lines in FIG. 5 schematically illustrate the flow of heat.

In this way, the heat H generated by the CPU 24 is absorbed by the heat pipe 32 through the heat receiving plate 46 and is transferred efficiently to be transmitted to the fin 28. On the way, the heat H transported by the heat pipe 32 is also transmitted to the vapor chamber 30 to be diffused and dissipated, and is also transmitted to the fin 28 at the same time. The heat H transferred to the fin 28 is then efficiently discharged to the outside of the chassis 14 by the air A blown from the exhaust ports 42b of the fans 26 and 27, which promotes heat dissipation.

That is, the cooling module 22 connects the heat pipe 32, which is connected to the CPU 24 or a heating element, not only to the fin 28 but also to the one edge of the vapor chamber 30, and the one edge of the vapor chamber 30 is connected to the fin 28.

With this configuration, the cooling module 22 of this embodiment keeps the cooling performance while reducing the cost compared to a conventional configuration having a larger area of the vapor chamber to absorb heat from the CPU directly and transferring the heat to the fin, for example. Vapor chambers are higher in component cost than typical heat pipes. The cooling module 22 of the present embodiment reduces the area of a high-cost vapor chamber 30 and complements the reduced area with the heat pipe 32 at a low cost. As a result, the cooling module 22 can achieve both cost reduction and enough cooling performance.

Moreover, the vapor chamber 30 doubles as the lower cover plate 42B of the fan housing 42. Therefore, the vapor chamber 30 also receives the cooling effect from the air circulating in the fan housing 42.

The following describes the result of an experiment comparing the cooling module 22 of the present embodiment with a comparative example that is a cooling module having the configuration illustrated in FIG. 2 but not having the heat pipe 32 and including the vapor chamber 30 that covers the CPU 24 and the fin 28 as a whole. The result of the experiment shows that the cooling module 22 in the present embodiment reduced the component cost by about 20% and reduced the noise from the fans 26 and 27 with the same cooling performance, compared to the comparative cooling module. In other words, it is shown that the cooling module 22 in this embodiment has higher cooling performance than the cooling module of the comparative example, because the present embodiment enables a larger number of revolutions of the fans with the same noise.

The cooling module 22 has high cooling performance, compared to another conventional cooling module that is configured so that the heat of the heating element is transferred to the heat pipe through the vapor chamber, and then the heat is transferred to the fin only through the heat pipe. This is because the cooling module 22 includes the heat pipe 32 connected to the fin 28 and the vapor chamber 30, and the vapor chamber 30 is also connected to the fin 28. Due to the heat dissipation at the vapor chamber 30 and the heat transfer to the fin 28, the cooling module 22 avoids the problem that the heat transfer from the heat pipe 32 to the fin 28 hinders adequate cooling of the CPU 24.

In the cooling module 22, the joint 30b without the closed space S1 of the vapor chamber 30 is connected to the heat pipe 32 and the fin 28. The first surface 30c of this joint 30b is positioned lower than the first surface 30c of the portion having the closed space S1 by the step 30a. With this configuration, the cooling module 22 allows the heat pipe 32 to be placed in the height wise empty space defined by the step 30a. This prevents the heat pipe 32 from protruding from the first surface 30c of the vapor chamber 30 and thus increasing the thickness of the entire module. Therefore, the height difference of the step 30a preferably is the same as the thickness of the heat pipe 32.

Moreover, the joint 30b does not have the closed space S1 therein, meaning that the vapor chamber 30 does not have a bending portion in the closed space S1 due to the step 30a. As a result, the vapor chamber 30 does not have a blocked portion of the closed space S1, which may decrease the efficiency of heat transport by the working fluid.

The present invention is not limited to the above-described embodiments, and can be modified freely without deviating from the scope of the present invention.

The invention claimed is:

1. A cooling module comprising:
   at least one fan having a fan housing with an intake port and an exhaust port;
   a fin that faces the exhaust port of the at least one fan;
   a heat pipe connected to a surface of the fin; and
   a plate-shaped vapor chamber having a first surface and a second surface, the heat pipe being connected to the first surface while straddling one edge of the vapor chamber, the second surface at the one edge being connected to the surface of the fin whereby the second surface is parallel with the heat pipe, and whereby the one edge is disposed between the heat pipe and the fin.

2. The cooling module according to claim 1, wherein the vapor chamber includes:
   two metal plates;
   a joint joining the two metal plates together at outer peripheral edges;
   a closed space defined between the two metal plates and surrounded by the joint; and
   working fluid enclosed in the closed space,
   the one edge is located at the joint, and
   a step between the first surface at the one edge and a first surface of a portion having the closed space, the step making the first surface at the one edge lower than the first surface of the portion having the closed space.

3. The cooling module according to claim 2, wherein the step has substantially a same height as a plate thickness of the heat pipe.

4. The cooling module according to claim 1, wherein the fan housing includes a cover plate that defines a top face or a bottom face of the fan housing, and the vapor chamber serves as the cover plate that defines one of the top and bottom faces.

5. The cooling module according to claim 4, further comprising:
   wherein the at least one fan is a pair of fans that are adjacent to each other, and
   the vapor chamber serves as the cover plate defining the one of the top and bottom faces for the fans as a pair.

6. The cooling module according to claim 1, further comprising
   a heat conduction sheet covering the first surface of the vapor chamber and the heat pipe.

7. An electronic apparatus comprising:
   a chassis;
   a heating element in the chassis; and
   a cooling module in the chassis, the cooling module absorbing heat generated from the heating element,
   the cooling module including:
      a fan having a fan housing with an intake port and an exhaust port;
      a fin that faces the exhaust port of the fan;
      a heat pipe having a first end connected to the heating element and a second end connected to a surface of the fin; and
      a plate-shaped vapor chamber having a first surface and a second surface, the heat pipe being connected to the first surface while straddling one edge of the vapor chamber, the second surface at the one edge being connected to a surface of the fin whereby the second surface is parallel with the second end of the heat pipe, and whereby the one edge is disposed between the heat pipe and the fin.

* * * * *